(12) United States Patent
Barana et al.

(10) Patent No.: US 10,252,709 B2
(45) Date of Patent: Apr. 9, 2019

(54) MOTORCYCLE HAVING A SYSTEM FOR INCREASING A REARING AND A TILTING LIMIT OF THE VEHICLE AND FOR INCREASING A LONGITUDINAL THRUST OF THE VEHICLE

(71) Applicant: DUCATI MOTOR HOLDING S.p.A., Bologna (IT)

(72) Inventors: Davide Barana, Mozzecane (IT); Federico Maldini, Bologna (IT); Leonardo Mossali, Bologna (IT)

(73) Assignee: DUCATI MOTOR HOLDING S.P.A., Bologna (IT)

( * ) Notice: Subject to any disclaimer, the term of this patent is extended or adjusted under 35 U.S.C. 154(b) by 278 days.

(21) Appl. No.: 15/206,766

(22) Filed: Jul. 11, 2016

(65) Prior Publication Data

US 2017/0015295 A1  Jan. 19, 2017

(30) Foreign Application Priority Data

Jul. 14, 2015 (IT) .......................... 102015000034109

(51) Int. Cl.
*B60W 10/06* (2006.01)
*B60W 40/11* (2012.01)
(Continued)

(52) U.S. Cl.
CPC ............. *B60W 10/06* (2013.01); *A01G 25/00* (2013.01); *A01G 25/16* (2013.01); *B62K 11/02* (2013.01);
(Continued)

(58) Field of Classification Search
CPC ............. B60W 40/11; B60W 2300/36; B60W 10/106; B60W 10/06; B62K 2207/00; B62K 2207/04; F01D 17/141
(Continued)

(56) References Cited

U.S. PATENT DOCUMENTS 5,426,571 A   6/1995  Jones
7,467,684 B2 * 12/2008 Wang .................. B60R 21/0132
                                                      180/282
(Continued)

FOREIGN PATENT DOCUMENTS

DE    10 2013 006 928 A1   10/2014

OTHER PUBLICATIONS

Italian Search Report for Italian Application No. IT UB20152174, completed on Jan. 6, 2016, seven pages.

*Primary Examiner* — Anne Marie M Boehler
(74) *Attorney, Agent, or Firm* — Vorys, Sater, Seymour and Pease LLP (57) ABSTRACT

A motorcycle including a frame to which an internal combustion engine is associated, from which internal combustion engine at least one exhaust pipe of combusted gases departs, the exhaust pipe having an open terminal, the frame mounted on a front wheel and a rear wheel, a control board or unit included, for controlling torque produced by the engine and other parameters such as velocity of the vehicle and spatial position thereof with respect to the road surface. The motorcycle including a system to verify when the front wheel of the motorcycle detaches from the road surface during acceleration. The system includes a choke for partializing the section of the exhaust gases outlet area from the exhaust pipe, during partialization. The partialization obtained as a function of the torque produced by the engine and the position of the front wheel with respect to the road surface.

19 Claims, 10 Drawing Sheets (51) Int. Cl.

| | | |
|---|---|---|
| *F01D 1/14* | (2006.01) | |
| *A01G 25/16* | (2006.01) | |
| *A01G 25/00* | (2006.01) | |
| *E02D 29/12* | (2006.01) | |
| *E02D 29/14* | (2006.01) | |
| *E03B 7/09* | (2006.01) | |
| *E03B 9/08* | (2006.01) | |
| *E03B 9/10* | (2006.01) | |
| *E03B 11/14* | (2006.01) | |
| *H02G 9/10* | (2006.01) | |
| *B62K 11/02* | (2006.01) | |
| *B65D 25/28* | (2006.01) | |
| *B65D 88/76* | (2006.01) | |
| *H02G 9/02* | (2006.01) | |
| *H05K 5/02* | (2006.01) | |

(52) U.S. Cl.
CPC ............ *B65D 25/28* (2013.01); *B65D 88/76* (2013.01); *E02D 29/12* (2013.01); *E02D 29/14* (2013.01); *E02D 29/1454* (2013.01); *E03B 7/095* (2013.01); *E03B 9/08* (2013.01); *E03B 9/10* (2013.01); *E03B 11/14* (2013.01); *H02G 9/02* (2013.01); *H02G 9/10* (2013.01); *H05K 5/0217* (2013.01); *B60W 2300/36* (2013.01); *B62K 2207/00* (2013.01); *B65D 2525/283* (2013.01); *Y02A 20/104* (2018.01); *Y10T 137/6995* (2015.04)

(58) Field of Classification Search
USPC .......................................... 180/219; 280/755
See application file for complete search history.

(56) References Cited

U.S. PATENT DOCUMENTS

| | | | | |
|---|---|---|---|---|
| 8,701,813 | B2* | 4/2014 | Shimizu | F01N 1/085 180/219 |
| 2005/0236205 | A1* | 10/2005 | Konno | B62K 19/30 180/219 |
| 2008/0306653 | A1* | 12/2008 | Hasegawa | B62K 25/04 701/38 |
| 2016/0009275 | A1* | 1/2016 | Hieda | B60K 28/16 701/70 |
| 2016/0368546 | A1* | 12/2016 | Wahl | B62D 37/00 |
| 2017/0120901 | A1* | 5/2017 | Igari | B60W 30/02 |

* cited by examiner

MOTORCYCLE HAVING A SYSTEM FOR INCREASING A REARING AND A TILTING LIMIT OF THE VEHICLE AND FOR INCREASING A LONGITUDINAL THRUST OF THE VEHICLE

The present invention relates to a motorcycle according to the preamble of the main claim.

As is known, a motorcycle comprises a frame associated to a front wheel and a rear wheel and an internal combustion engine, able to generate a torque which, via a transmission, is sent to the rear wheel of the vehicle. A control unit controls the value of the torque, by means of a control of the supply of the usual flow of air and fuel to the cylinders of the engine and the injection parameters of said fluids and ignition of the mixture in said cylinders.

The control unit is also connected to various sensors associated to the vehicle able to identify the position of the vehicle with respect to the ground on which the vehicle is moving (such as the inclinations along the three axes, being roll, yaw, pitch of the frame) or the detaching of the front wheel from the ground due to a rearing of the vehicle when accelerating) and is able to detect the velocity of the vehicle.

As is known, in motorcycles, the engine, when generating the above-mentioned torque, enables the rear wheel to cause a traction thrust that enables the vehicle to move. Systems have been known for some time for controlling rearing, which by acting on various parameters, such as for example the opening of the butterfly valves of the engine and the spark advance, enable keeping the vehicle at the maximum acceleration value possible at every instant, without causing backwards tilting (rearing) due to excessive thrust due to the torque produced by the internal combustion engine.

These known systems, however, enable, for the most part, preventing tilting by limiting the torque produced, but do not physically oppose it, i.e. by generating forces on the frame such as to cause a momentum applied on the centre of gravity of the vehicle that is able to oppose the momentum that tends to raise the front wheel from the ground.

US 2008/0306653 describes an apparatus for controlling an engine of an off-road vehicle such as a motorcycle or a snowmobile so as to stem engine overspeed i.e. an excessive rotation thereof during off-road use and in particular during a leap. The apparatus comprises a control circuit that detects whether the vehicle is performing a leap and in that case limits the number of engine revolutions. This is done by controlling for example acceleration components of the vehicle or the activation state of the engine before the leap, in particular for example by controlling the acceleration component perpendicular to the motion direction: if this component assumes a value that is a different to a determined threshold value, this leads to detecting that the vehicle is in a leap state. Consequently the number of revolutions of the engine are limited (for example by intervening on the control of the ignition timing of the engine).

Therefore US 2008/0306653 determines a condition of detachment of the vehicle from the ground and modifies the number of engine revolutions for as long as the condition endures.

US 2008/0306653, therefore, describes an apparatus that reduces the torque of the engine during a particular off-road use step of the vehicle (during a leap), but does not describe the possibility of having greater torques (and therefore a greater number of revolutions of the engine) without the motorcycle experiencing rearing. This prior art also does not disclose how to exploit the greater torque for adding a further acceleration thrust to the vehicle; on the contrary, by reducing the number of engine revolutions US 2008/0306653 reduces the possible torque transferred to the wheel and therefore also reduces the possible acceleration thrust of the vehicle.

US 2008/0306653 therefore does not enable increasing the acceleration of a motorcycle and at the same time, in conditions of greater torque generated by the engine, does not enable forward displacing of the vehicle tilt limit. This prior art discloses an apparatus that works in an opposite way to a system enabling development of a greater torque available for the motorcycle from its engine, but which does not lead to a rearing or tilting. Neither does US 2008/0306653 describe a system enabling the motorcycle engine to unload to the ground a greater thrust without having a raising of the front wheel of the vehicle.

U.S. Pat. No. 5,426,571 discloses a device enabling maintaining a beam of light, emitted by the front headlight of a motorcycle, constantly parallel to the road surface when the vehicle is moving around a bend or there is a lateral lowering of the vehicle. The prior art includes measuring the distance from the road surface of the flanks of the motorcycle so as to be able to intervene on a support device of the front headlight of the vehicle that moves as a function of the lean of the motorcycle and the distance of a flank thereof from the ground surface. This device, as it moves, corrects the axis of the light beam emitted by the headlight during the leaning of the motorcycle so as to maintain the beam parallel to the road surface.

A limiting of the output power of the engine is also described, when a lean angle exceeds a predetermined value.

This prior art document also does not describe how to increase (not reduce) the power (or torque) generated by the engine of a motorcycle and unload it on the ground on which the motorcycle is moving without causing a rearing of the vehicle.

U.S. Pat. No. 5,426,571 does not describe any system which, while increasing the torque transferred from the engine to the rear wheel of the vehicle, enables keeping the vehicle on the road surface without raising the front wheel thereof.

DE 102013006928 describes a turbocharger for an internal combustion engine, in particular, a diesel engine in which a turbine is provided having a casing which has an inlet channel upstream of the impeller of the turbine and an outlet channel downstream of the impeller. The section of this channel can be modified by choke means of the section area thereof. With this modification of the partialisation of the outlet channel or discharge channel of the turbine, the efficiency of the turbine itself is increased in particular when the load on the delivery of the internal combustion engine is low.

DE 102013006928 does not address the problem of maintaining a motorcycle with both wheels on the ground even when increasing the torque transmitted to the rear wheel of the vehicle, nor does it describe how to increase the power generated by the engine and unload it on the ground via the rear wheel without causing the detachment of the front wheel from the ground.

This problem is therefore not addressed by any of the prior documents US 2008/0306653, U.S. Pat. No. 5,426,571 and DE 102013006928. These documents neither describe nor suggest any device or system applied to the terminal part of an exhaust pipe of a motorcycle (taken to mean the end part of the exhaust pipe of the combusted gases which leaves from the engine and usually terminates in proximity or on either side of or superiorly of the rear wheel of the motorcycle) enabling preventing the tilting or rearing of the vehicle when high torques are produced and without partialising the power generated by the engine.

The aim of the present invention is therefore to disclose a motorcycle provided with an improved system for opposing the rearing movement of the vehicle, i.e. the raising from the ground of the front wheel thereof, and which displaces the tilting limit of the vehicle forwards.

In particular the aim of the invention is to provide a motorcycle with a system of the described type with which the tilting limit can be reached by a developing of torques of higher than (and therefore greater accelerations than) those that can be reached by existing systems before the motorcycle (given a same weight condition and a same centre of gravity position) raises the front wheel from the ground and tilts, and without partialising the development of torque from the engine to the rear wheel of the vehicle.

A further aim is to provide a motorcycle of the described type wherein said system, given an equal torque generated by the engine with the known solutions, also enables adding a further acceleration thrust on the vehicle without causing a tilting of the vehicle.

A further aim of the invention is to provide a motorcycle of the described type the construction of which does not lead to significant structural modification or modification to the control of the vehicle.

These and other aims, which will be clear to the expert in the sector, are attained by a motorcycle according to the appended claims.

For a better understanding of the present invention the following drawings are attached, purely by way of non-limiting example, in which.

With reference to the figures, a motorcycle according to the invention is denoted in its entirety by reference numeral 1 and comprises a frame 2 (in the example of the figures, covered by a fairing) to which is associated an internal combustion engine 3 and to which a front wheel 4 and a rear wheel 5 are constrained. Combusted gases exit from the engine and are sent to at least one exhaust pipe 6, two in the figures, the exhaust pipe being taken to mean a pipe that departs from the engine and terminates in proximity of the rear wheel 5 of the motorcycle.

Figure 3:
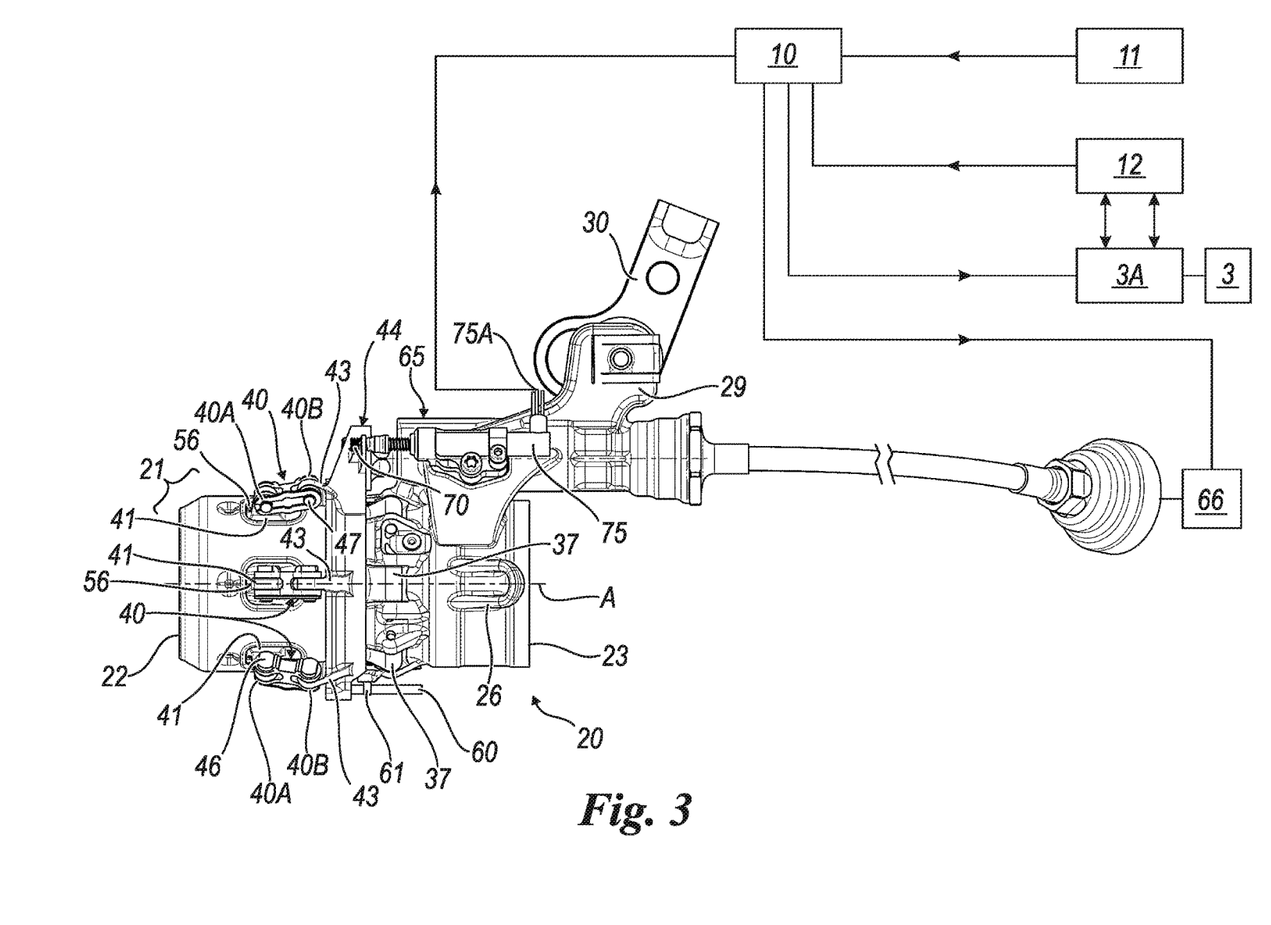
FIG. 3 is a lateral view of a part of the system of the motorcycle according to the invention and a block diagram also illustrating other components of the vehicle.
Figure 4:
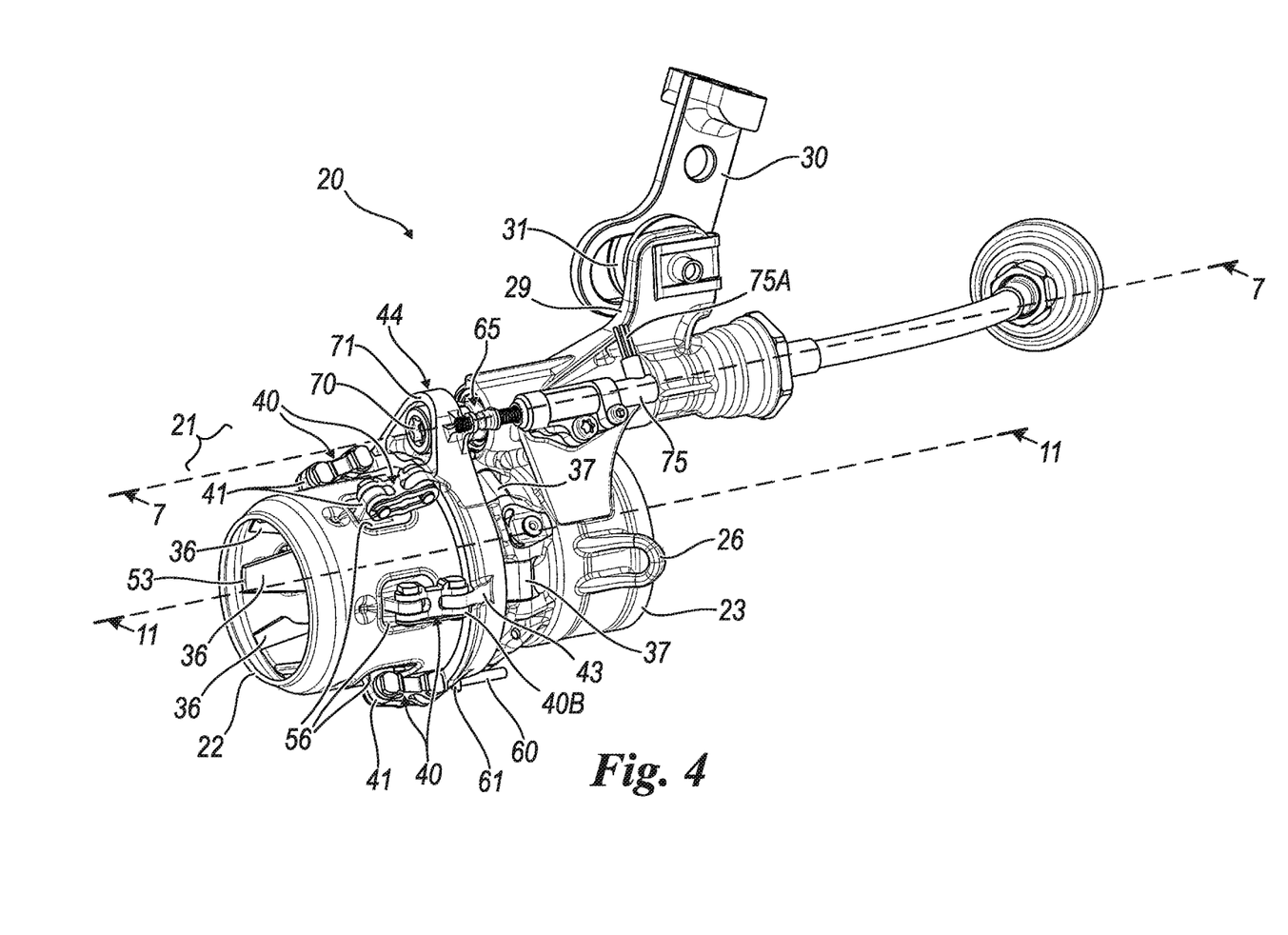
FIG. 4 is a perspective front view of the part of the system of FIG. 3.
Figure 5:
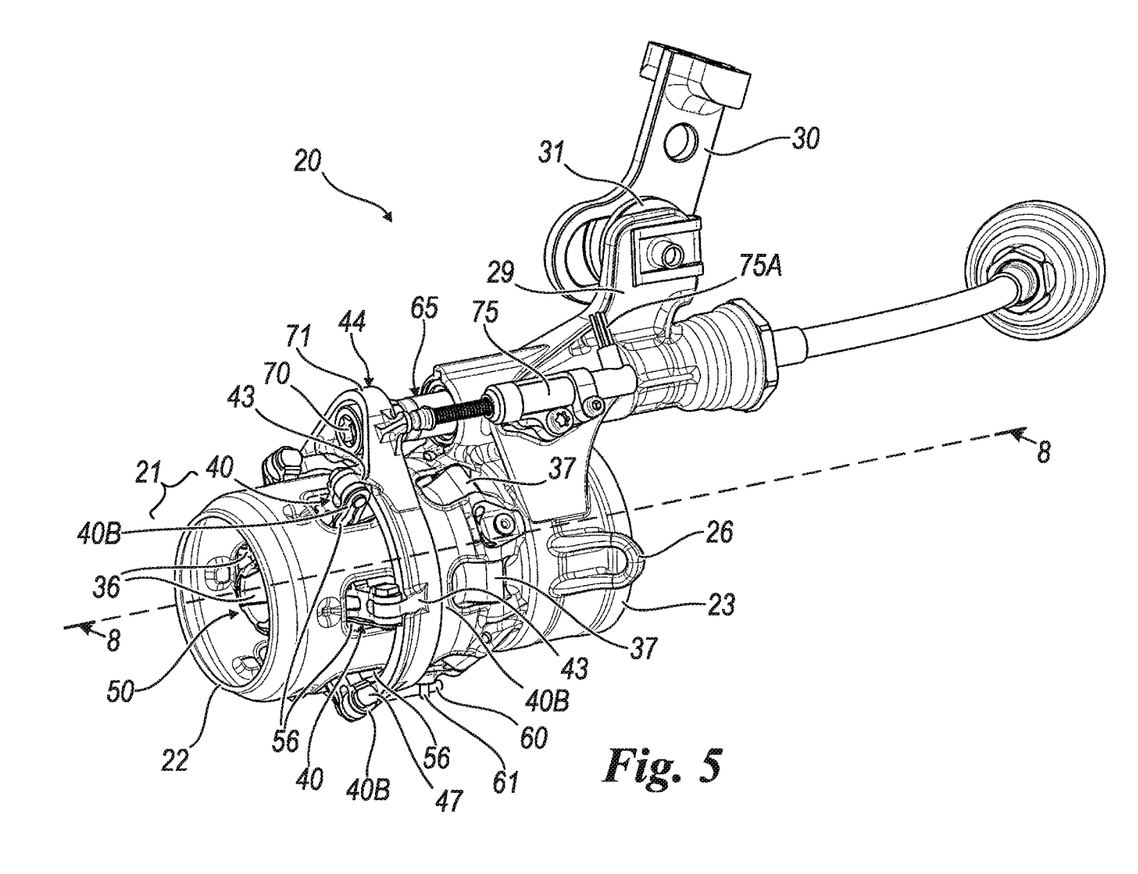
FIG. 5 is a perspective front view of the part of the system of FIG. 4, but during a different use thereof.
Figure 6:
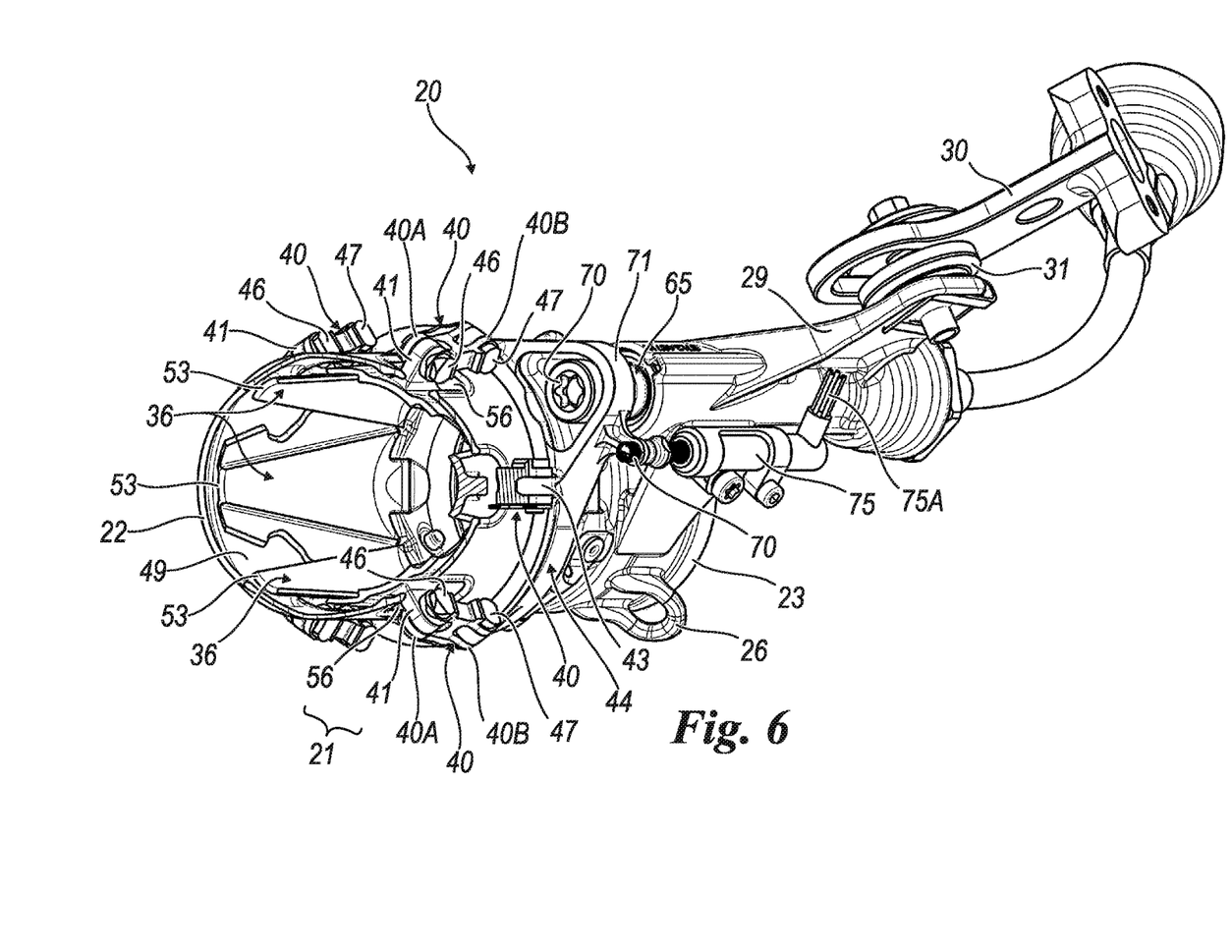
FIG. 6 is a perspective front view of the part of the system of FIG. 4; but with a portion in cross section for greater clarity.
Figure 7:
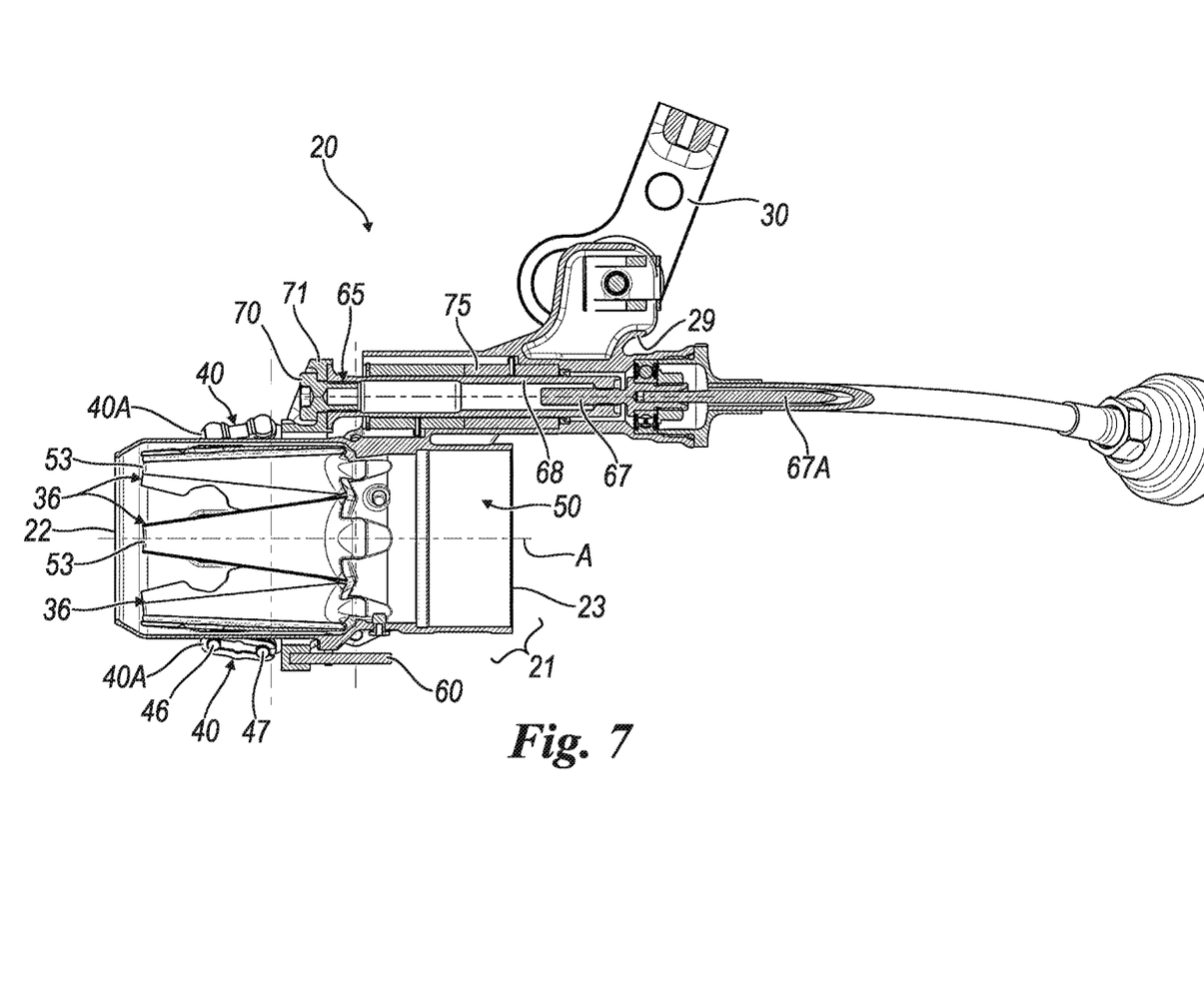
FIG. 7 is a perspective section view according to line 7-7 of FIG. 4.
Figure 8:
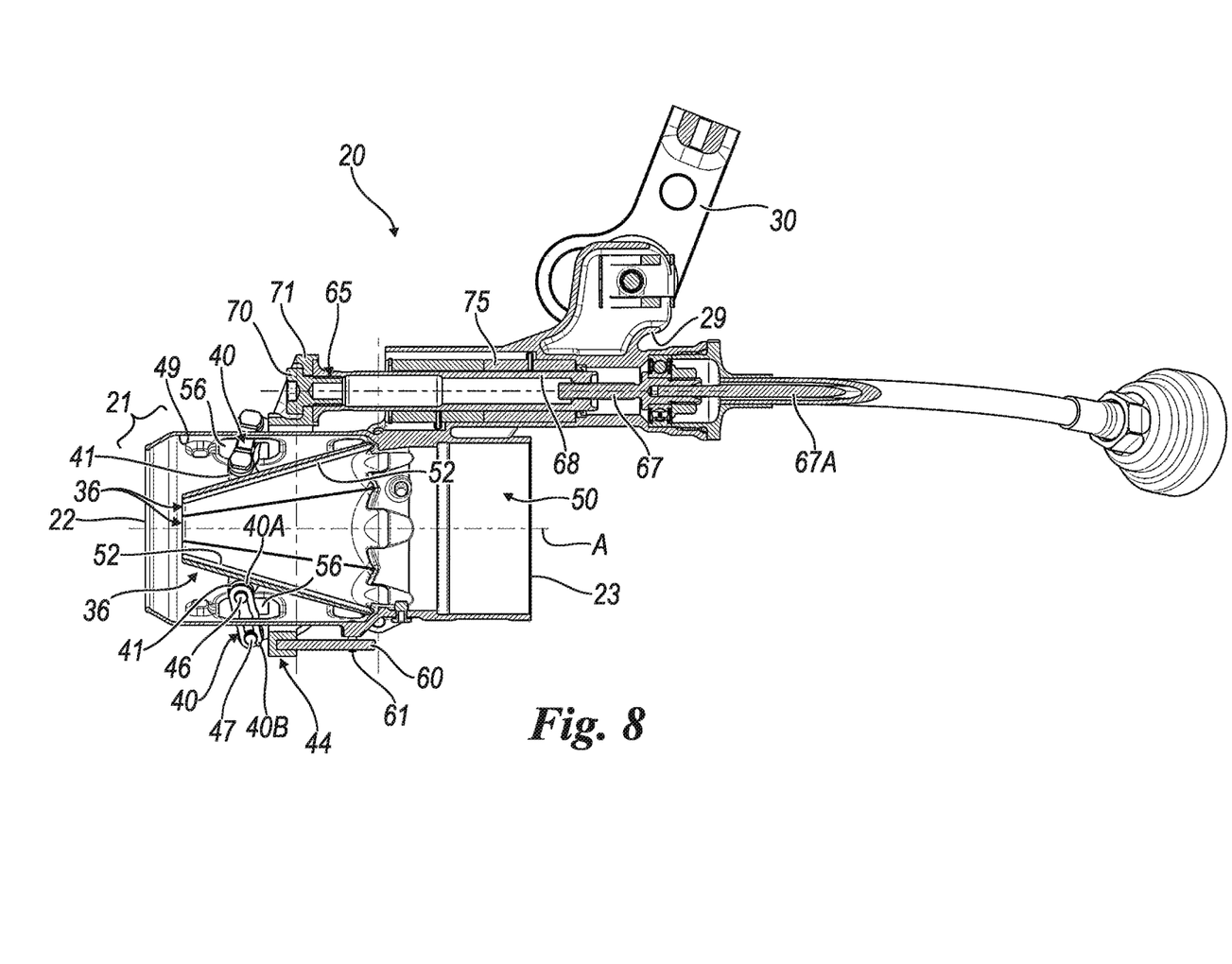
FIG. 8 is a perspective section view according to line 8-8 of FIG. 5.
Figure 9:
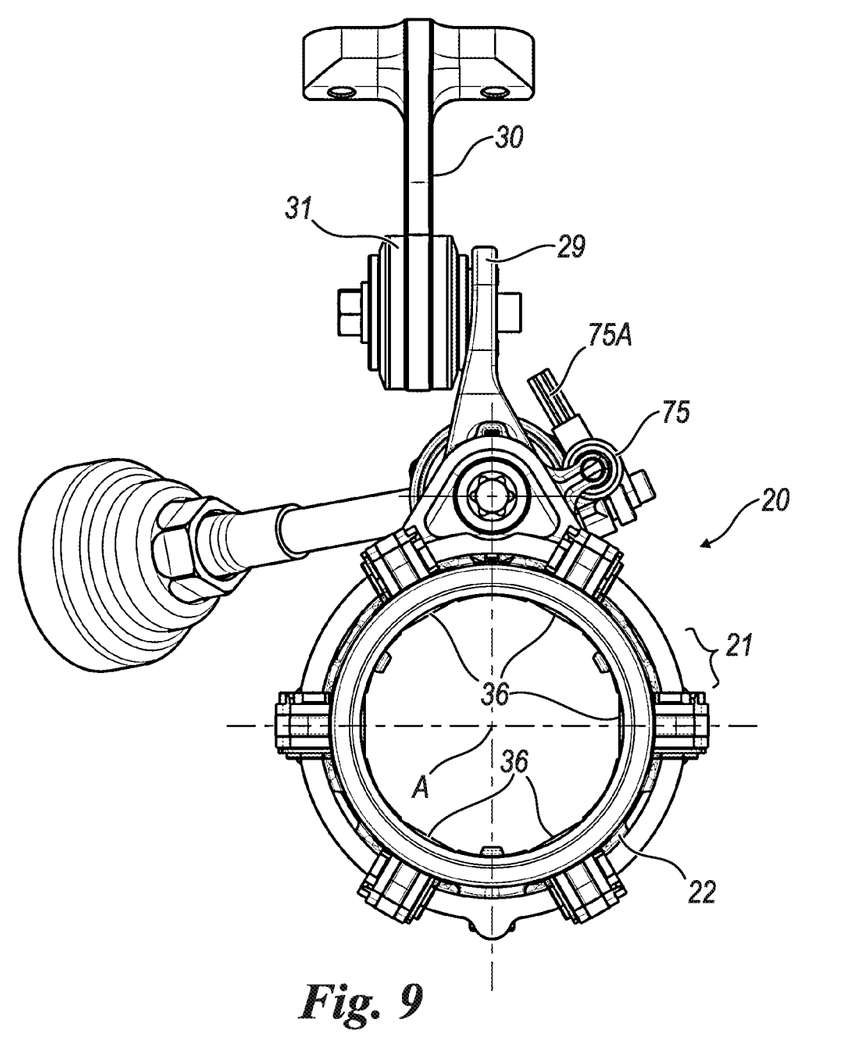
FIG. 9 is a front view of the part of FIG. 4.
Figure 10:
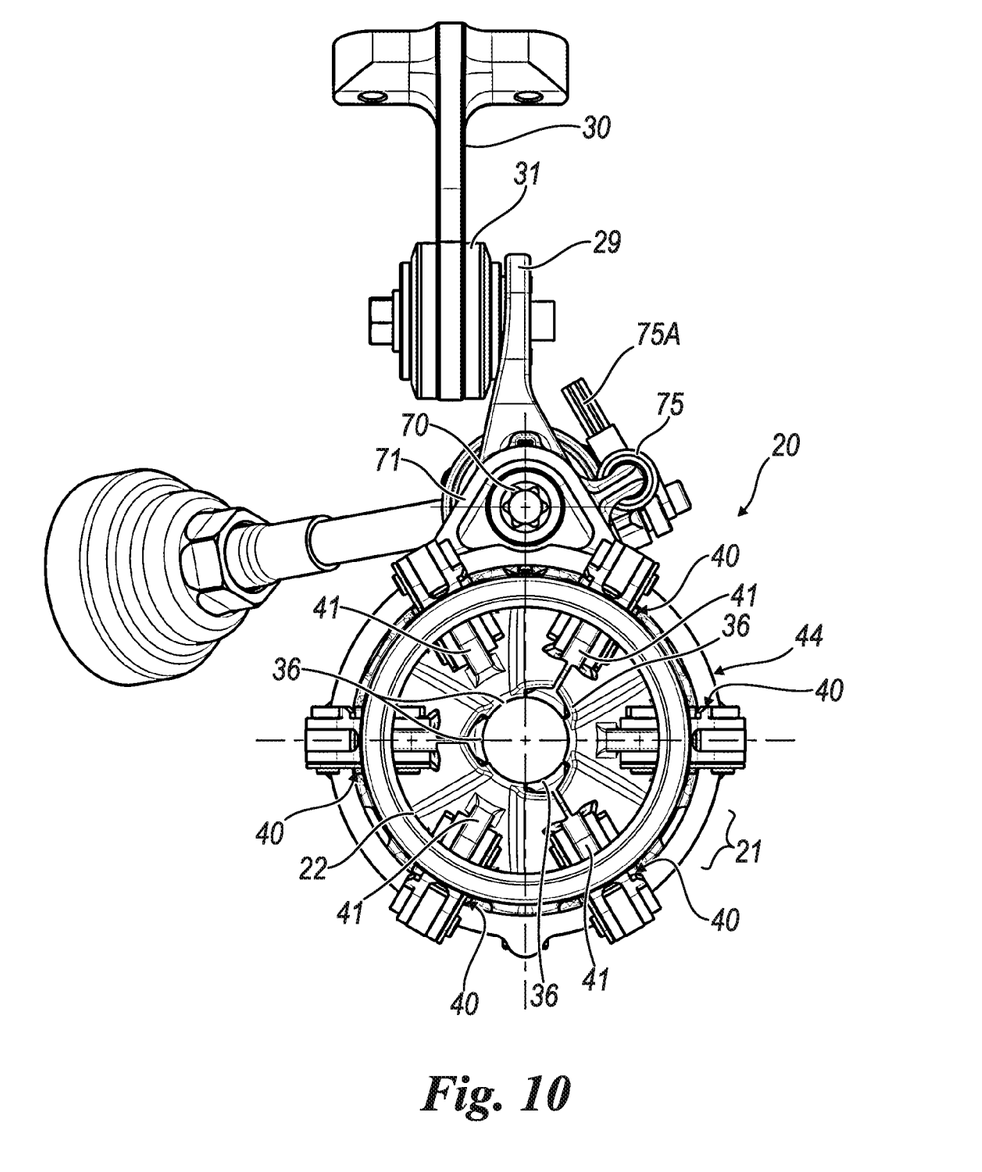
FIG. 10 is a front view of the part of FIG. 5.
Figure 11:
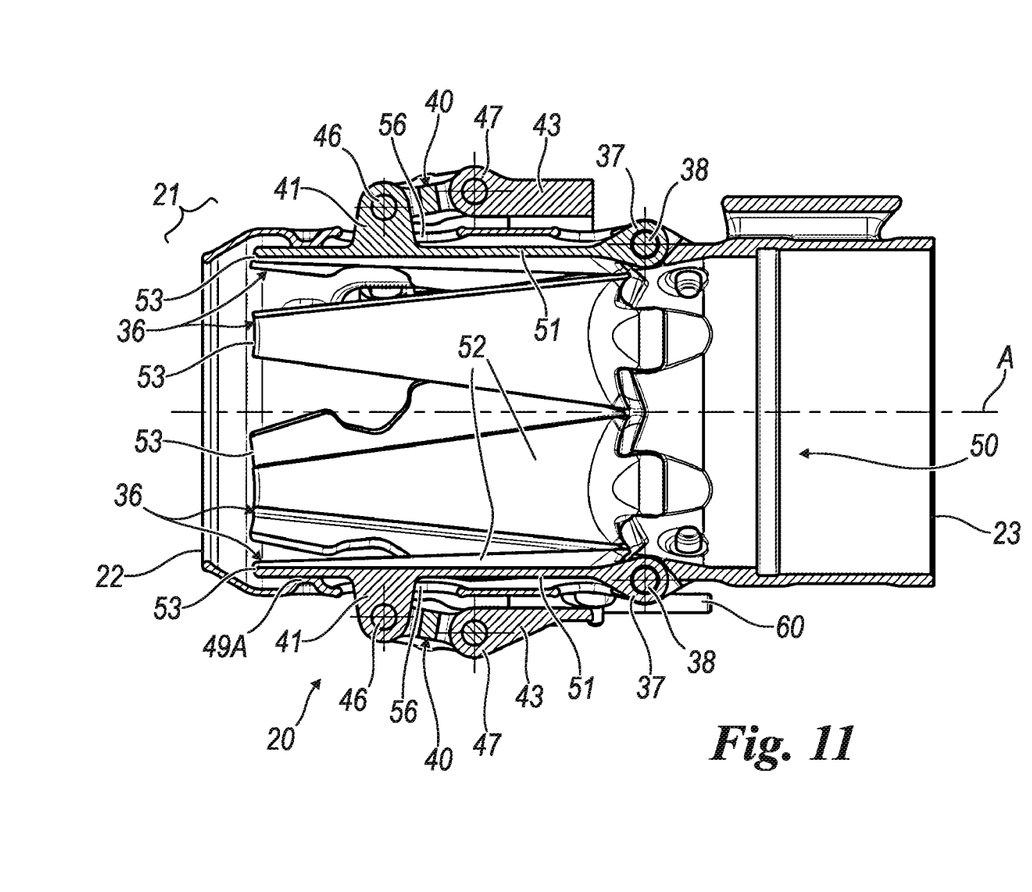
FIG. 11 is a section view according to line 11-11 of FIG. 4.

The motorcycle comprises a control unit of the vehicle which is connected to a plurality of sensor organs present on the vehicle, such as accelerometers, velocity sensors, potentiometers present on the suspensions and an initial platform which detects the movements of the motorcycle in space (such as inclinations on the ground on which the motorcycle is moving and/or oscillations along the vehicle axis. All these sensor devices or organs are denoted in their entirety by block 11 of FIG. 3.

The control unit 10 is also connected to sensors dedicated to detecting the engine's functioning, such as sensors that detect the ignition in the engine cylinders, the position of the butterfly valves present in the engine intake conduits or in any case upstream thereof, or which detect the injection parameters in the cylinder. These sensors or detection organs are denoted in their entirety by block 12 of FIG. 3.

Lastly this unit 3 is connected to functional organs 3A of the engine 3 (shown in FIG. 3) as well as to the engine injectors, the ignition coils of the cylinders, the rotary actuators of the butterfly valves so as to command the functioning of the engine. The motorcycle 1 comprises a system enabling opposing the tendency of the vehicle to rear i.e. opposing the tendency of the front wheel to lift from the ground when power is unloaded onto the ground with the rear wheel. At the same time this system, as well as displacing forwards the tilting (rearing) limit of the vehicle at high torque values produced by the engine (and therefore the power unloaded on the ground), enables adding a further acceleration thrust on the motorcycle (without this causing tilting and without exploiting the traction friction capacity on the rear tyre) in addition to the thrust generated by the engine.

For this purpose, a device 20 is present at the terminal part of each exhaust pipe 6 of the vehicle which device enables partialising the outlet area of the exhaust gases towards the external environment, while keeping (in the embodiment illustrated in the figures) the flow of the gases centred on a median axis A of the area, i.e. maintaining the flow as uniform as possible with respect to and along the axis. At the same time, the above-mentioned flow in the device is made to converge towards the above-mentioned axis when the above-mentioned area is partialised. This is all with the aim of generating forces and momentum which oppose the tendency of the vehicle to tilt and at the same time increase the acceleration thereof.

Further, the partialisation is obtained in a controlled way and as a function of the power produced by the engine so that the anti-tilt effect is dependent on the torque produced by the engine.

More particularly, the (partialising) device 20 comprises a tubular body 21 having a first end 22 and a second end 23. The terminal portion of the exhaust pipe 6 is coupled to the second end 23, the exhaust pipe 6 being inserted in the second end so that the flow of the exhaust gases passes from the second end 23 to the first end 22 of the body 21.

In proximity of the above-mentioned end 23, the body 21 comprises at least one annular element 26 able to cooperate with springs (not illustrated) which maintain the body 21 associated to the exhaust pipe. The springs contribute to enabling the body 21 to withstand the vibrations generated in the exhaust pipe 6 during use of the vehicle.

The body 21 further comprises a tab 29 to which a bracket 30 is fixed for constraining the body to the frame 2 of the motorcycle. An elastic bushing (silent block) 31 is interposed between the tab 29 of said body and the bracket 30, which contributes to the damping of the vibrations experienced by the body during use of the vehicle.

The body 21, as mentioned, is tubular and internally contains means able to partialise the section or passage area of the exhaust gases and able in any case to maintain, in the embodiment of the figures, a flow of these gases centred on the longitudinal axis A of the body. The axis coincides with the longitudinal axis of the exhaust pipe 6. In other words, the choke means limit (or broaden) the passage area of the gases by closing (or opening) it symmetrically about said axis.

Additionally, the choke means operate the limitation by in any case causing the flow of the gases towards the axis, preventing turbulence within the body 21.

In greater detail, the choke means are a plurality of elements or wings (or petals) 36 constrained to a first end 37 thereof to a pin 38 fixed to the body 21. Each wing is subject to a moving pusher organ defined by a rod-shaped element, or rod 40 (defining a pusher member), hinged at a first end 40A thereof to a projection 41 of the wing and at a second end 40B thereof to an element 43 solidly constrained to an annular body 44 positioned externally of the body 21. The above-mentioned hinges are respectively defined by pins 46 and 47.

The wings or petals 36 are able to move together towards and from the above-mentioned axis A so as to modify the passage section or area of the exhaust gases in a uniform and symmetrical way about the axis.

Each wing has a conformation that is such as to approach and substantially rest on a wall 49 of a conduit 50 of the tubular body 21. In particular, with reference to the conduit, each wing has an external wall 51 able to rest on an annular relief 49A of the wall 49, when the wing is in a position that does not partialise the gas discharge area (the section of the conduit 50) and an internal wall 52 (facing the interior of the conduit 50) at least in part curvilinear.

Further, each wing tapers going from the first end 37 to a second end 53 (free end) in proximity of which the above-mentioned projection 41 is located. The projection passes through an opening 56 made in the body 21 so as to be connectable to the ends 40A of the rod 40 which, when the conduit 50 is not partialised, is totally external of the exhaust pipe. When the conduit 50 is partialised, the rod 40 penetrates into the opening 56, pushed by thrust of the annular body. The annular body 44 is mobile parallel to the axis A, and is guided by at least one pin 60 that is mobile in a guide 61 solidly constrained to the body 21. The movement of the annular body 44 is generated by an actuator defined, preferably in a non-limiting embodiment of the invention, by a worm screw 65 actuated by an electric motor 66 through a connecting organ defining a pusher member 67 connected to a flexible cable 67A activated by the electric motor. The pusher member 67 is mobile i.e. rotating in a lining 68 solidly constrained to the body 21. The screw 65 is fixed at an end 70 thereof, to a projection 71 of the annular body 44. The pusher member 67 and the relative lining 68 define a further guide element of the displacement of the above-mentioned annular body 44 parallel to the axis W. The motor, in the functioning thereof, is subject to the control of the unit 10.

With this configuration, the activating of the electric motor 66 leads to the movement of the screw 65 with a consequent displacement of the annular body 50 on the body 21 of the device 20 along the axis A. Following this there is a rotary movement (about the hinge 47) of each rod 40 and the corresponding movement of each wing 36 in the conduit 50 in rotation about the hinge thereof (defined by the pin 38) which constrains it to the body 21.

It is to be noted that the electric motor 66 is fixed to the frame 2 in a known way in a distant position from the device 20 and therefore from the exhaust pipe 6 of the vehicle (with the aim of preventing exposure of the motor 66 to the heat of the exhaust pipe). For this reason, said motor is connected to the worm screw 65 via the flexible cable 67A.

The pusher member 67 moves, as mentioned, in the lining 68 to which a measuring organ 75 is associated, the organ being able to measure the displacement of the organ 67, such as for example a linear potentiometer. The organ or potentiometer 35 is connected to the control unit 10 (by means of a connector 75A) which in this way detects the position of the organ 63 in the lining 68 and therefore the degree of partialisation of the conduit 50 of the device 20 (and therefore the area of discharge of the combusted gases from the engine).

The unit 10, which thus is apprised of the functioning parameters of the engine 3 and the spatial position of the motorcycle, is able to activate the electric motor 66 with the purpose of partialising or not the conduit 50 so as to generate a thrust (a reaction thrust) at the outlet thereof, which contributes to accelerating the vehicle and can in part oppose the tendency of the vehicle to rear. This action of the unit 10 is therefore carried out as a function of the torque produced by the engine and the eventual raising of the wheel from the road surface.

Figure 1:
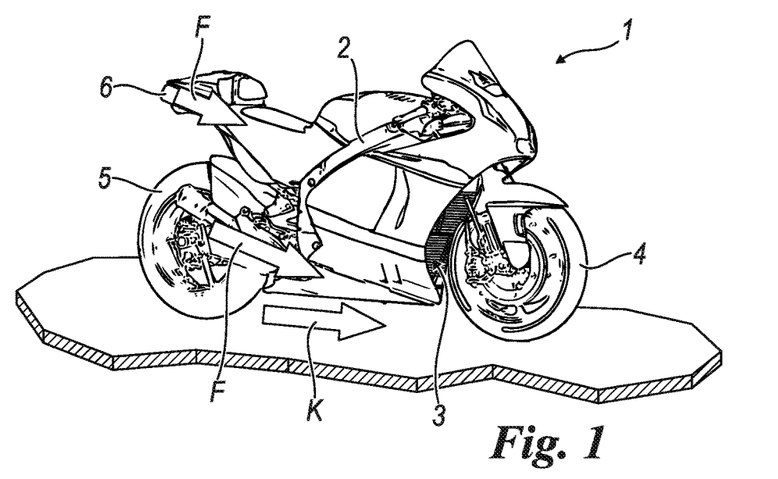
FIGS. 1 and 2 show, respectively, in a slightly perspective front and lateral view, a motorcycle according to the invention, with the figures highlighting the forces and movements acting on the vehicle during use.
Figure 2:
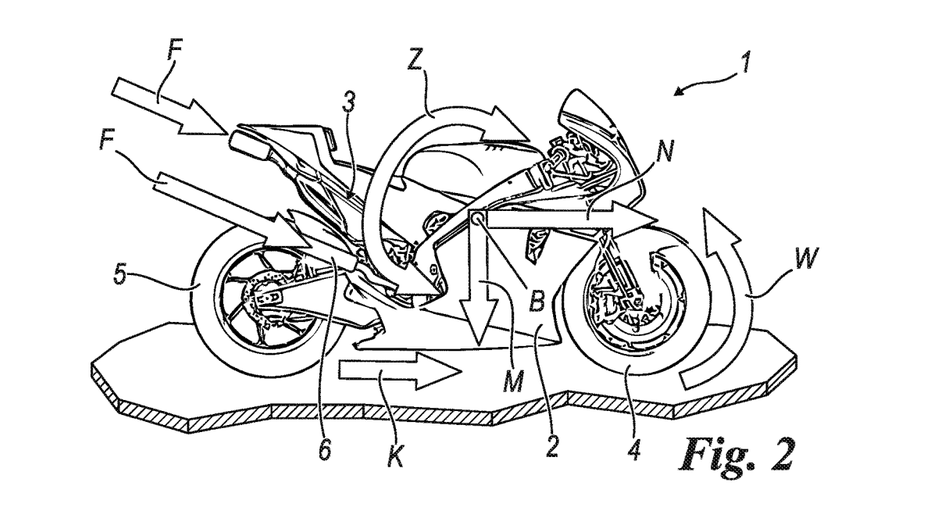

With reference to FIGS. 1 and 2, the system of the invention has, as a principle thereof, the aim of emphasising and optimising the thrust of the reaction that can be obtained by discharge of the combusted gases in motorcycles provided with a reciprocating internal combustion engine. In the present case, the engine 3 installed on the frame 2 produces a torque which is sent from the drive shaft (via the usual transmission) to the rear wheel 5. Traction thrust is realised in the contact with the ground (arrow K in FIGS. 1 and 2) which, lastly, generates the movement of the vehicle 1.

In its functioning, the engine processes a fluid (air) which is first aspirated, then heated by combustion and made to work on the pistons with the aim of extracting torque and power towards the shaft, and lastly is newly discharged into the atmosphere at high temperature and velocity. The acceleration to which the fluid is subjected generates, by the principle of conservation of momentum and the principle of action and reaction, an additional thrust on the vehicle. Each exhaust pipe 6 has, with the outlet of the exhaust gases from the terminal part thereof, a thrust (arrow F) the line of action of which is perpendicular to the outlet section and passes through the centre of gravity of the section.

The forces or thrusts F, brought to bear on the centre of gravity B of the vehicle, generate forces with a perpendicular component to the ground (force and arrow M) and parallel to the ground (force and arrow N) (FIG. 2). The component or force N thus generates a thrust that is summed to the force transmitted by the engine 3 to the wheel 5 (indicated by arrow K).

The forces F further generate, at the centre of gravity B, a momentum (arrow Z) which opposes the momentum (arrow W) generated by the thrust or force K, keeping the front wheel 4 on the ground in a case in which the force K grows due to a greater torque produced by the engine.

In greater detail, in the absence of the device 20 (commanded by the unit 10), the engine (still commanded or controlled by the unit 10) generates a torque C1 such as to give the following ratio $$K = m \cdot a$$

where: K is the thrust or force deriving from the torque C1; m=equivalent mass (also including the inertia effects of all the members in rotation) of the vehicle-rider system; a=acceleration of the vehicle.

In a case where the motorcycle 1 is equipped with the device 20, the engine can produce a torque C2 (with C2>C1) without there being a tilting of the vehicle due to the momentum Z which opposes the momentum W. Further, the thrust force or traction thrust K1 unloaded onto the ground is greater than the force K (being C2>C1) and the ratio that links the acceleration force also comprises the component or thrust N deriving from the thrust F generated by the exhaust gases exiting from the exhaust pipes 6 of the vehicle.

In these conditions, therefore, the usual formula which links the force to the acceleration and to the mass is as follows, considering that the thrust force is given by the sum of K1 and N:

$$K1+N=m \cdot a_1$$

Since K1+N>K (given an m that does not vary), it follows that $a_1$>a.

Thus, with the invention, there is an increase in the acceleration of the vehicle, while displacing the tilting limit of the vehicle forwards, i.e. enabling the unloading onto the ground of a greater thrust (K1) without there being a raising of the front wheel 4.

A preferred embodiment of the invention has been described. Other embodiments are however possible. For example, the device 20 can be a part of the exhaust pipe 6, or the actuating of the choke means can take place in a different way to what has been previously described (for example by means of a linear electric or hydraulic actuator, utilising lever systems or flexible cables). In other embodiments, the choke means partialise the unloading area in a not necessarily axial-symmetric way. This is, for example, achieved by means of mobile separating walls, section obturators, systems enabling selectively sending the flow onto two or more distinct outlets characterised by different outlet areas.

The various embodiments are also therefore considered to fall within the scope of the present invention as defined by the claims that follow.

The invention claimed is:

1. A motorcycle comprising:
   a frame to which an internal combustion engine is connected, from which internal combustion engine at least one exhaust pipe of combusted gases departs,
   the exhaust pipe having an open terminal portion, said open terminal portion having a longitudinal axis (A), the exhaust pipe having an outlet area of exhaust gases from said exhaust pipe,
   said frame being mounted on a front wheel and a rear wheel,
   a control board or control unit being included, for controlling a torque produced by the engine and the velocity of the motorcycle and the spatial position of the motorcycle with respect to the road surface,
   a system able to verify when the front wheel of the motorcycle detaches from the road surface during an acceleration, wherein the system comprises choke means for partialising a section of the outlet area of exhaust gases from said exhaust pipe, the partialisation being obtained as a function of the torque produced by the engine and the position of the front wheel with respect to said road surface to enable increasing thrust on the motorcycle of the combusted gases in outlet from the exhaust pipe and opposing tendency of the front wheel to lift,
   wherein said choke means are part of a partialising device located at the terminal portion of the exhaust pipe, said partialising device having a body fixed to said exhaust pipe and to the frame of the motorcycle or said partialising device being an integral part of said exhaust pipe.

2. The motorcycle of claim 1, wherein the choke means partialise the outlet area of the exhaust gases in a uniform and symmetrical way with respect to the longitudinal axis (A) of the exhaust pipe, at the same time causing the flow of combusted gases to converge towards said axis (A) during the partialisation.

3. The motorcycle of claim 1, wherein the choke means are mobile from and towards the longitudinal axis (A) of the exhaust pipe, an actuator for moving the choke means being provided, connected to and commanded by the control board or control unit of the motorcycle as a function of the torque produced by the engine.

4. The motorcycle of claim 3, wherein said choke means comprise a plurality of wings fixed at a first end thereof with respect to the above-mentioned longitudinal axis (A) and mobile with a second end thereof towards and from said longitudinal axis (A), said wings being arranged about said longitudinal axis (A).

5. The motorcycle of claim 3, wherein said actuator is a hydraulic actuator, a mechanical actuator or comprises a linear electric motor.

6. The motorcycle of claim 3, comprising detecting means able to detect a displacement of said actuator to detect a position of the choke means, said detecting means connected to the control board or control unit of the motorcycle.

7. The motorcycle of claim 1, wherein said control board or control unit is connected to sensors present on the motorcycle.

8. The motorcycle of claim 1, wherein said control board or control unit is connected to sensors present on the motorcycle, said sensors selected from the group consisting of accelerometers, velocity sensors, potentiometers present on a suspension of the motorcycle, sensors able to detect the movements of the motorcycle in space, sensors relating to ignition of fuel in cylinders of the engine, and injection parameter sensors of the engine.

9. A motorcycle comprising:
   a frame to which an internal combustion engine is connected, from which internal combustion engine at least one exhaust pipe of combusted gases departs,
   the exhaust pipe having an open terminal portion, said open terminal portion having a longitudinal axis (A), the exhaust pipe having an outlet area of exhaust gases from said exhaust pipe,
   said frame being mounted on a front wheel and a rear wheel,
   a control board or control unit being included, for controlling a torque produced by the engine and the velocity of the motorcycle and the spatial position of the motorcycle with respect to the road surface,
   a system able to verify when the front wheel of the motorcycle detaches from the road surface during an acceleration, wherein the system comprises choke means for partialising a section of the outlet area of exhaust gases from said exhaust pipe, the partialisation being obtained as a function of the torque produced by the engine and the position of the front wheel with respect to said road surface to enable increasing thrust on the motorcycle of the combusted gases in outlet from the exhaust pipe and opposing tendency of the front wheel to lift,
   wherein the choke means are mobile from and towards the longitudinal axis (A) of the exhaust pipe, an actuator for moving the choke means being provided, connected to and commanded by the control board or control unit of the motorcycle as a function of the torque produced by the engine, wherein said choke means comprise a plurality of wings fixed at a first end thereof with respect to the above-mentioned longitudinal axis (A) and mobile with a second end thereof towards and from said longitudinal axis (A), said wings being arranged about said longitudinal axis (A), wherein said choke means are part of a partialising device located at the terminal portion of the exhaust pipe, said partialising device having a body fixed to said exhaust pipe and to the frame of the motorcycle, wherein the first end of each wing is hinged to the body of the partialising device, the wing cooperating with a pusher organ having a first end hinged to the wing and a second end external of said body, an opening being afforded in the body through which the organ reaches a respective said wing, the above-mentioned second end being hinged to an element solidly constrained to an annular body positioned externally of said body, mobile along the body parallel to the longitudinal axis (A) of the exhaust pipe and directly subject to the action of the actuator for moving the choke means, said annular body moving all the wings present inside said body of the partialising device towards and away from the axis (A).

10. The motorcycle of claim 9, wherein the choke means partialise the outlet area of the exhaust gases in a uniform and symmetrical way with respect to the longitudinal axis (A) of the exhaust pipe, at the same time causing the flow of combusted gases to converge towards said axis (A) during the partialisation.

11. The motorcycle of claim 9, wherein the actuator is a hydraulic actuator, a mechanical actuator, or comprises a linear electric motor.

12. The motorcycle of claim 9, wherein said control board or control unit is connected to sensors present on the motorcycle, said sensors selected from the group consisting of accelerometers, velocity sensors, potentiometers present on a suspension of the motorcycle, sensors able to detect the movements of the motorcycle in space, sensors relating to ignition of fuel in cylinders of the engine, and injection parameter sensors of the engine.

13. The motorcycle of claim 9, comprising detecting means able to detect a displacement of said actuator to detect a position of the choke means, said detecting means connected to the control board or control unit of the motorcycle.

14. The motorcycle of claim 9, wherein said control board or control unit is connected to sensors present on the motorcycle.

15. A motorcycle comprising:
a frame to which an internal combustion engine is connected, from which internal combustion engine at least one exhaust pipe of combusted gases departs,
the exhaust pipe having an open terminal portion, said open terminal portion having a longitudinal axis (A), the exhaust pipe having an outlet area of exhaust gases from said exhaust pipe,
said frame being mounted on a front wheel and a rear wheel,
a control board or control unit being included, for controlling a torque produced by the engine and the velocity of the motorcycle and the spatial position of the motorcycle with respect to the road surface,
a system able to verify when the front wheel of the motorcycle detaches from the road surface during an acceleration, wherein the system comprises choke means for partialising a section of the outlet area of exhaust gases from said exhaust pipe, the partialisation being obtained as a function of the torque produced by the engine and the position of the front wheel with respect to said road surface to enable increasing thrust on the motorcycle of the combusted gases in outlet from the exhaust pipe and opposing tendency of the front wheel to lift,
wherein the choke means are mobile from and towards the longitudinal axis (A) of the exhaust pipe, an actuator for moving the choke means being provided, connected to and commanded by the control board or control unit of the motorcycle as a function of the torque produced by the engine,
wherein said choke means comprise a plurality of wings fixed at a first end thereof with respect to the above-mentioned longitudinal axis (A) and mobile with a second end thereof towards and from said longitudinal axis (A), said wings being arranged about said longitudinal axis (A),
wherein said choke means are part of a partialising device located at the terminal portion of the exhaust pipe, said partialising device having a body fixed to said exhaust pipe and to the frame of the motorcycle;
wherein said actuator is a worm screw located on said body of the partialising device, said worm screw being connected to a flexible cable moved by an electric motor located distant from the exhaust pipe, the worm screw being solidly constrained at a free end thereof to an annular body positioned externally of the body.

16. The motorcycle of claim 15, wherein the choke means partialise the outlet area of the exhaust gases in a uniform and symmetrical way with respect to the longitudinal axis (A) of the exhaust pipe, at the same time causing the flow of combusted gases to converge towards said axis (A) during the partialisation.

17. The motorcycle of claim 15, comprising detecting means able to detect a displacement of said actuator to detect a position of the choke means, said detecting means connected to the control board or control unit of the motorcycle.

18. The motorcycle of claim 15, wherein said control board or control unit is connected to sensors present on the motorcycle.

19. The motorcycle of claim 15, wherein said control board or control unit is connected to sensors present on the motorcycle, said sensors selected from the group consisting of accelerometers, velocity sensors, potentiometers present on a suspension of the motorcycle, sensors able to detect the movements of the motorcycle in space, sensors relating to ignition of fuel in cylinders of the engine, and injection parameter sensors of the engine.

* * * * *